(12) United States Patent
Kakinoki

(10) Patent No.: US 6,186,801 B1
(45) Date of Patent: Feb. 13, 2001

(54) PC CARD

(75) Inventor: Wataru Kakinoki, Yokohama (JP)

(73) Assignee: Murata Manufacturing Co., Ltd. (JP)

( * ) Notice: Under 35 U.S.C. 154(b), the term of this patent shall be extended for 0 days.

(21) Appl. No.: 09/349,858

(22) Filed: Jul. 8, 1999

(30) Foreign Application Priority Data

Jul. 10, 1998 (JP) .................................................. 10-211843

(51) Int. Cl.[7] .......................... H01R 13/648; H01R 4/66; H01R 12/00; H05K 1/00; H05K 1/14
(52) U.S. Cl. ...................... 439/95; 439/76.1; 439/607; 439/946; 361/737
(58) Field of Search ........................... 439/95, 76.1, 946, 439/92, 607; 361/737

(56) References Cited

U.S. PATENT DOCUMENTS

| | | | |
|---|---|---|---|
| 5,940,275 | * 8/1999 | Laity | ...................................... 361/737 |
| 6,004,144 | * 12/1999 | Yeh et al. | ............................. 439/76.1 |
| 6,106,309 | * 8/2000 | Kakinoki | ................................. 439/92 |

* cited by examiner

*Primary Examiner*—Paula Bradley
*Assistant Examiner*—Edwin A. León
(74) *Attorney, Agent, or Firm*—Ostrolenk, Faber, Gerb & Soffen, LLP

(57) ABSTRACT

A ground electrode is disposed between a card-side connector and an upper panel, movably forward or backward in the card insertion direction, the ground electrode including protuberances projecting through the protuberance receiving holes of the upper panel. The ground electrode is energized to move forward in the card insertion direction by means of a torsion spring such that, when the PC card is inserted into a 16-bit card slot corresponding to a predetermined high driving voltage, the protuberances in the protuberance receiving holes are moved backward in the card insertion direction against the spring force of the torsion spring.

13 Claims, 8 Drawing Sheets

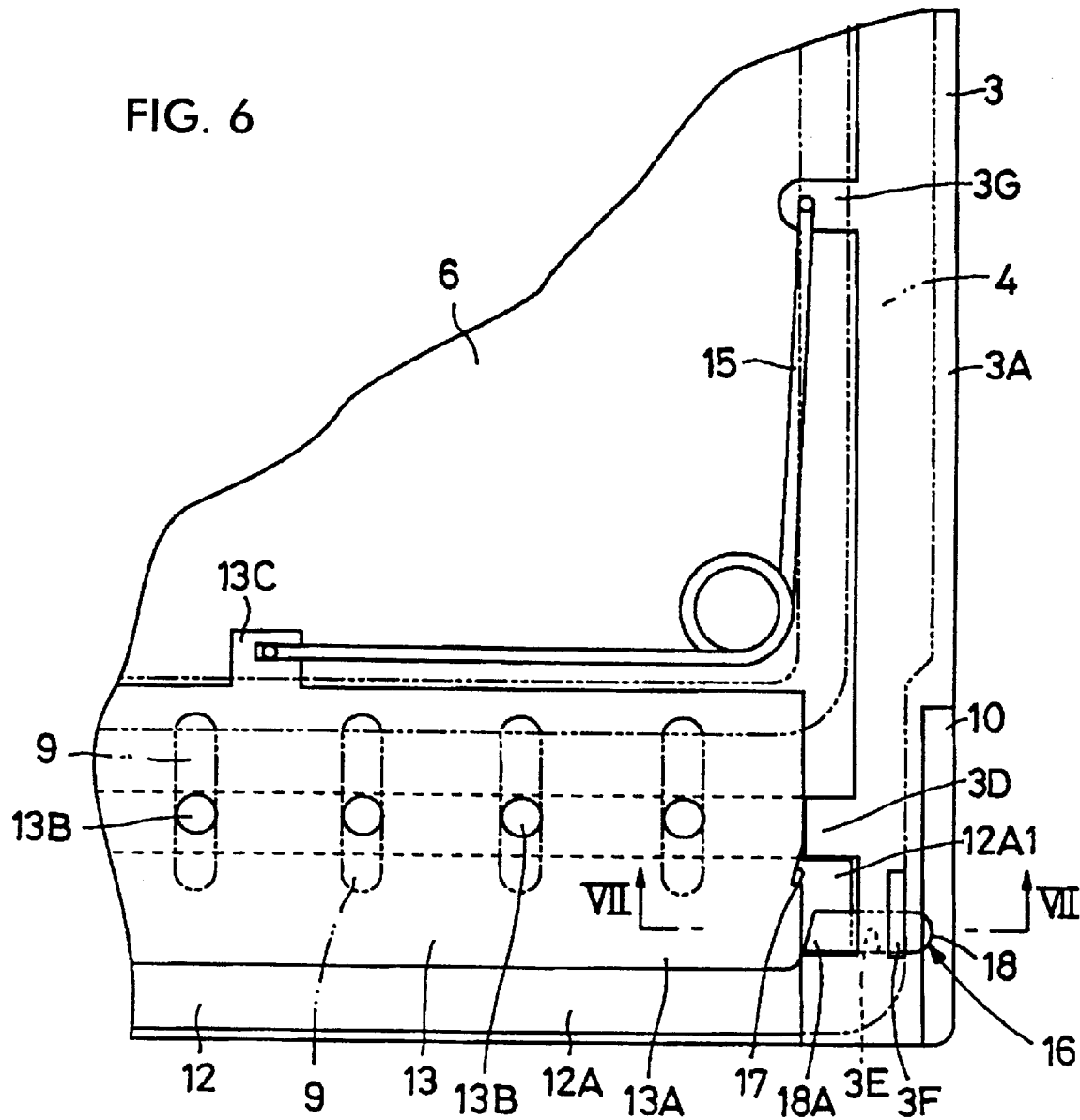

PC CARD

BACKGROUND OF THE INVENTION

1. Field of the Invention

The present invention relates to a PC card which is inserted into a card slot of a personal computer, for example, in order to extend the functions of the personal computer.

2. Description of the Related Art

In general, a personal computer is made up mainly of a computer body having an operation function, a memory function, and the like, a key board for inputting a signal to the computer body, a memory including a floppy disk and the like for storing memory in the computer body, and a display for indicating a program, an operational result, and the like.

Furthermore, the personal computer is provided with a card slot into which a PC card can be additionally attached in order to extend the memory contained in the computer body, add a modem, provide an IDE interface with an external CD-ROM drive and a hard disk, and the like. The size and shape of the PC card is specified by PC Card Standard and Standard by JEIDA (Japan Electric Industry Development Association).

For personal computers, a 32-bit byte has been gradually employed instead of a 16-bit byte in order to enhance processing speeds. Accordingly, there are two types of PC cards having respective sizes and shapes, that is, 16-bit PC cards and 32-bit PC cards. Similarly, card slots on the personal computer side are roughly divided into two groups, that is, 16-bit and 32-bit card slots.

Further, with respect to personal computers, in order to reduce the consumption electric power, the driving voltage for the computer body has been changed from 5.0 V to 3.3 V. For ordinary uses, the driving voltage for 16-bit PC cards is set at 5.0 V, while that for 32-bit PC cards at 3.3 V. Since the driving voltage has been reduced from 5.0 V to 3.3 V, the 32-bit PC card and the card slot are provided with ground electrodes for reinforcing the grounding, in order to secure the transmission or reception of a signal between the PC card and the personal computer.

The PC card is provided with a card key groove formed on the left side viewed in the card insertion direction, so that the PC card can be prevented from being improperly inserted, turned inside out, and can be distinguished between 16-bit and 32-bit PC card types. The card-side key groove of the 16-bit PC card is wider than that of the 32-bit PC card.

With this difference between the card-side key groove widths, the 16-bit PC card can be inserted into the 16-bit card slot and also into the 32-bit card slot. On the other hand, the 32-bit PC card can only be inserted into the 32-bit card slot, and is prevented from being inserted into the 16-bit card slot. As a result, the respective protuberances of the ground electrode provided for the card slot of the 32-bit PC card are prevented from being inserted into the 16-bit card slot which has no parts for receiving the protuberance. This protects the ground electrode, the card insertion hole of the card slot, and the like.

A 32-bit PC card of the above-described type is disclosed in Japanese Unexamined Patent Publication No. 9-58163, and is publicly known.

The PC card produced according to the above-described conventional technology includes a frame of which one end functions as a connector-attachment port and accommodates a circuit board inside thereof. Two panels form lids at the opposite sides of the frame and a connector is disposed in the connector attachment port of the frame for connecting the circuit board to the personal computer. A ground electrode is provided between one of the two panels and the connector for connecting the ground of the circuit board to the ground of the personal computer.

Further, one of the two panels is perforated to provide plural protuberance-receiving holes in the position corresponding to the connector attachment port. The ground electrode is composed of a flat plate elongated in the connector-lengthwise direction and protuberances are formed on the flat plate and project through the respective protuberance-receiving holes.

The above-described conventional 16-bit PC card is provided with the card-side key groove having a different size from that of the 32-bit PC card so that it can be distinguished from the 32-bit PC card, and moreover, the 32-bit PC card can be prevented from being inserted into the 16-bit card slot, as described above.

On the other hand, users require PC cards which are available as both the 16-bit and 32-bit cards. For the purpose of meeting this requirement, it is necessary to provide a PC card which can be inserted into either of the 16-bit and 32-bit card slots, irrespective of the shapes and sizes of the card slots of personal computers.

SUMMARY OF THE INVENTION

Accordingly, it is an object of the present invention to solve the above-described conventional technical problems and to provide a personal computer (PC) card for both of higher-bit and lower-bit information which can be inserted or removed from either of card slots for the higher-bit and lower-bit cards.

In order to achieve the above object, according to an aspect of the present invention, there is provided a PC card which comprises a frame of which one end functions as a connector attaching port and which accommodates a circuit board inside thereof, two sheets of panels for lidding the opposite sides of the frame, respectively, a connector disposed in the connector attaching port of the frame for connecting the circuit board to the personal computer, and a ground electrode provided between one of the two sheets of panels and the connector for connecting the ground of the circuit board to the ground of a card slot provided for the personal computer.

The PC card in accordance with the present invention is characterized in that one panel is provided with long protuberance-receiving holes in the position corresponding to the connector attaching port of the frame, the protuberance-receiving holes being elongated in the card insertion direction and being formed by drilling. The ground electrode is formed of a flat plate disposed between the connector and the one panel and is movable forward and backward in the card insertion direction. Protuberances are formed on the flat plate and projected through the respective protuberance receiving holes and the ground electrode is provided with means for energizing the ground electrode to move forward in the card insertion direction.

With the above-described configuration, when the PC card is inserted into the card slot corresponding to a predetermined low driving voltage, the protuberances can be connected to the ground electrode of the card slot, not moving backward in the card insertion direction even though the protuberances of the PC card come into contact with the ground electrode of the card slot, since they are energized to move forward in the card insertion direction together with the ground electrode by means of the energizing means.

On the other hand, when the PC card is inserted into the card slot corresponding to a predetermined high driving voltage, the respective protuberances in the protuberance-receiving holes, though they are energized to move forward in the card insertion direction together with the ground electrode by means of the energizing means, can be moved backward in the card insertion direction against the energizing force of the energizing means, due to the fact that the protuberances of the PC card comes into contact with the peripheral wall of the card slot.

Preferably, the frame is provided with an electrode moving means which enables or disables the ground electrode to or from being moved backward in the card insertion direction.

With the above configuration, for example, when the PC card is inserted into the card slot corresponding to the predetermined high driving voltage, the ground electrode of the PC card is moved backward in the card insertion direction against the energizing means, so that the protuberances in the protuberance-receiving holes can be moved backward in the card insertion direction.

Also preferably, the electrode moving means has the configuration that when the PC card is inserted into the card slot on the personal computer side, the ground electrode is enabled to move backward in the card insertion direction provided that the card slot corresponds to the predetermined high driving voltage, and the ground electrode is prevented from moving backward in the card insertion direction provided that the card slot corresponds to the predetermined low driving voltage.

According to the JEIDA Standard, the key-shape portion of the PC card has a groove-shape, and the groove width is large when the PC card corresponds to the predetermined high driving voltage, and is small when the PC card corresponds to the predetermined low voltage. On the other hand, the key-shape portion of the card slot has a groove-shape, and the groove width is large when the card slot corresponds to the predetermined high driving voltage, and is large when the card slot corresponds to the predetermined low driving voltage. Further, the ground electrode is formed only when the card slot corresponds to the predetermined high driving voltage. The key shape portion of the PC card of the present invention has a large groove width corresponding to the predetermined high driving voltage, and the electrode moving means is provided in the vicinity of the key shape portion.

Accordingly, when the PC card is inserted into the card slot (corresponding to the high driving voltage) of which the key shape portion has the wide groove width, the protuberances can be connected to the ground electrode on the card slot side without moving backward in the card insertion direction in the protuberance-receiving holes, since the ground electrode of the PC card is prevented from moving backward in the card insertion direction by means of the electrode moving means.

On the other hand, when the PC card is inserted into the card slot of which the key-shape portion has a small groove width (corresponding to the low driving voltage), the electrode moving means enables the ground electrode to move backward in the card insertion direction, so that the respective protuberances in the protuberance-receiving holes can be moved backward in the card insertion direction.

Preferably, the electrode moving means is composed of a notch formed on the flat plate of the ground electrode, and includes a movable piece of which the base end comes into contact with the notch such that it is detachably engaged therewith, and the top side is projected into the key-shape portion provided near to the connector attaching port side of the frame.

With the above-described configuration, for example, when the PC card is inserted into the card slot of which the key shape portion has a large groove width, the tip of the movable piece does not contact the side wall of the key-shape portion on the card slot side, so that the movable piece is projected from the key-shape portion, and the base end of the movable piece is engaged with the notch of the ground electrode, and thereby, the ground electrode is prevented from moving backward in the card insertion direction.

On the other hand, when the PC card is inserted into the card slot of which the key-shape portion has a mall groove width, the tip of the movable piece comes into contact with the side wall of the key shape portion on the card slot side, so that the movable piece is pushed inward from the key-shape portion, and the base end of the movable piece is disengaged from the notch of the ground electrode. This enables the ground electrode to move backward in the card insertion direction against the energizing means.

The key-shape portion may have a groove width corresponding to the predetermined high driving voltage for the card slot.

With the above configuration, when the PC card is inserted into the card slot corresponding to the low driving voltage, the tip of the movable piece, projected from the side wall of the key-shape portion, is not in contact with the side wall of the key shape portion on the card slot side, and the ground electrode is prevented from being moved backward in the card insertion direction by means of the electrode moving means.

On the other hand, when the PC card is inserted into the card slot corresponding to the high driving voltage, the tip of the movable piece, projected from the side wall of the key-shape portion, is pushed in by the side wall of the key-shape portion on the card slot side, and thereby, the electrode moving means is automatically released, enabling the ground electrode to move in the card insertion direction.

BRIEF DESCRIPTION OF THE DRAWINGS

FIG. 6 is an enlarged plan view showing the engaging portion of the movable piece is disengaged from the notch of the ground electrode, viewed from a similar position as in FIG. 3;

DESCRIPTION OF THE PREFERRED EMBODIMENT

Figure 1:
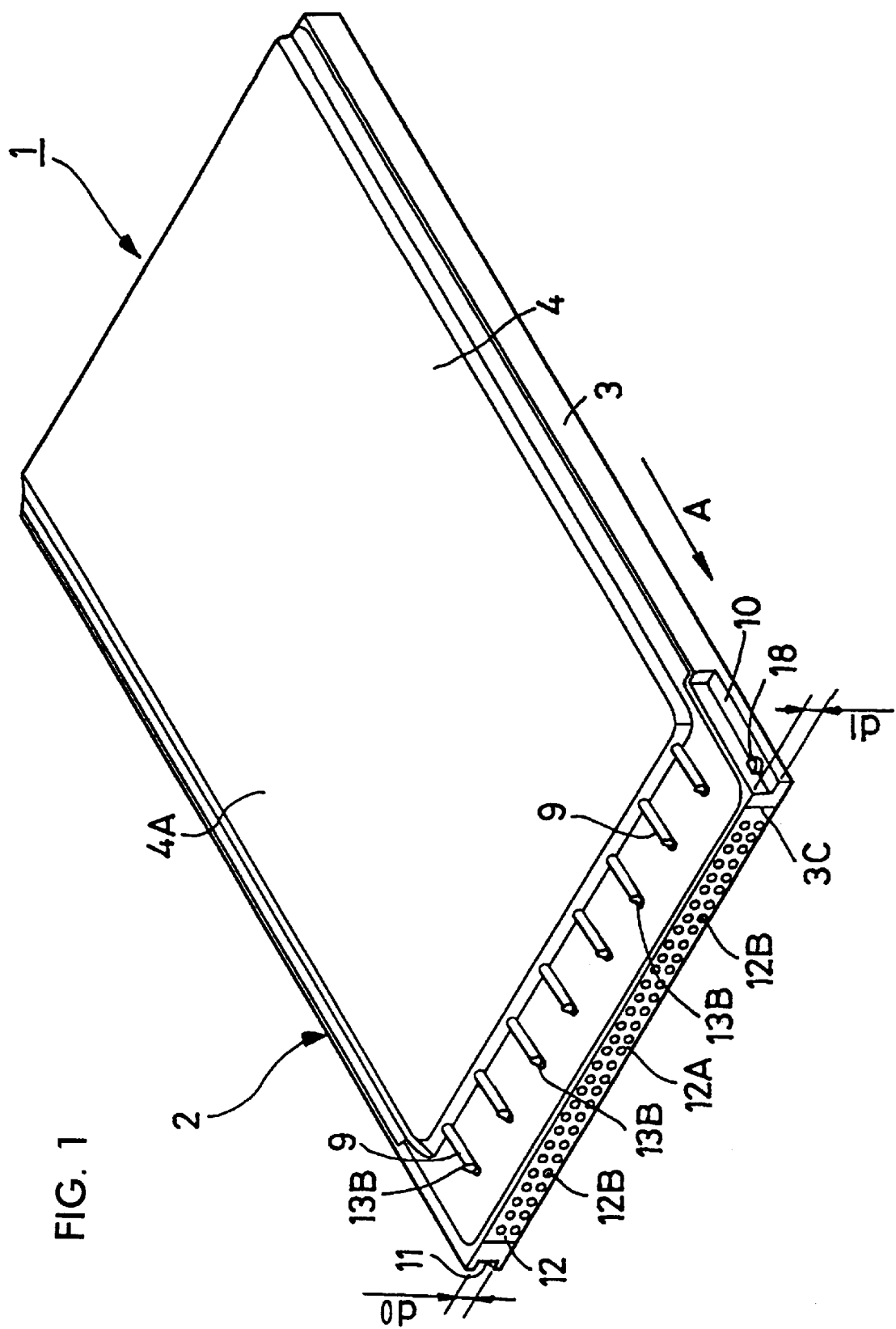
FIG. 1 is a perspective view of a PC card according to an embodiment of the present invention.

A preferred embodiment of a PC card in accordance with the present invention will be now described with reference to FIGS. 1 through 11.

A PC card 1 of the instant embodiment is adapted for both 16-bit and 32-bit slots. A casing 2 constitutes the contour of the PC card 1 and is formed in a thin sheet shape. The casing 2 is composed of a frame 3 which is thin and has openings in the upper and lower sides, respectively; an upper panel 4 for lidding (e.g., closing) the upper opening of the frame 3 and which includes a rectangular bulging portion 4A; and a lower panel 5 (see FIGS. 10 and 11) for lidding the lower opening of the frame 3 and which has a rectangular bulging portion 5A. A space 6 accommodates a board therein.

Figure 2:
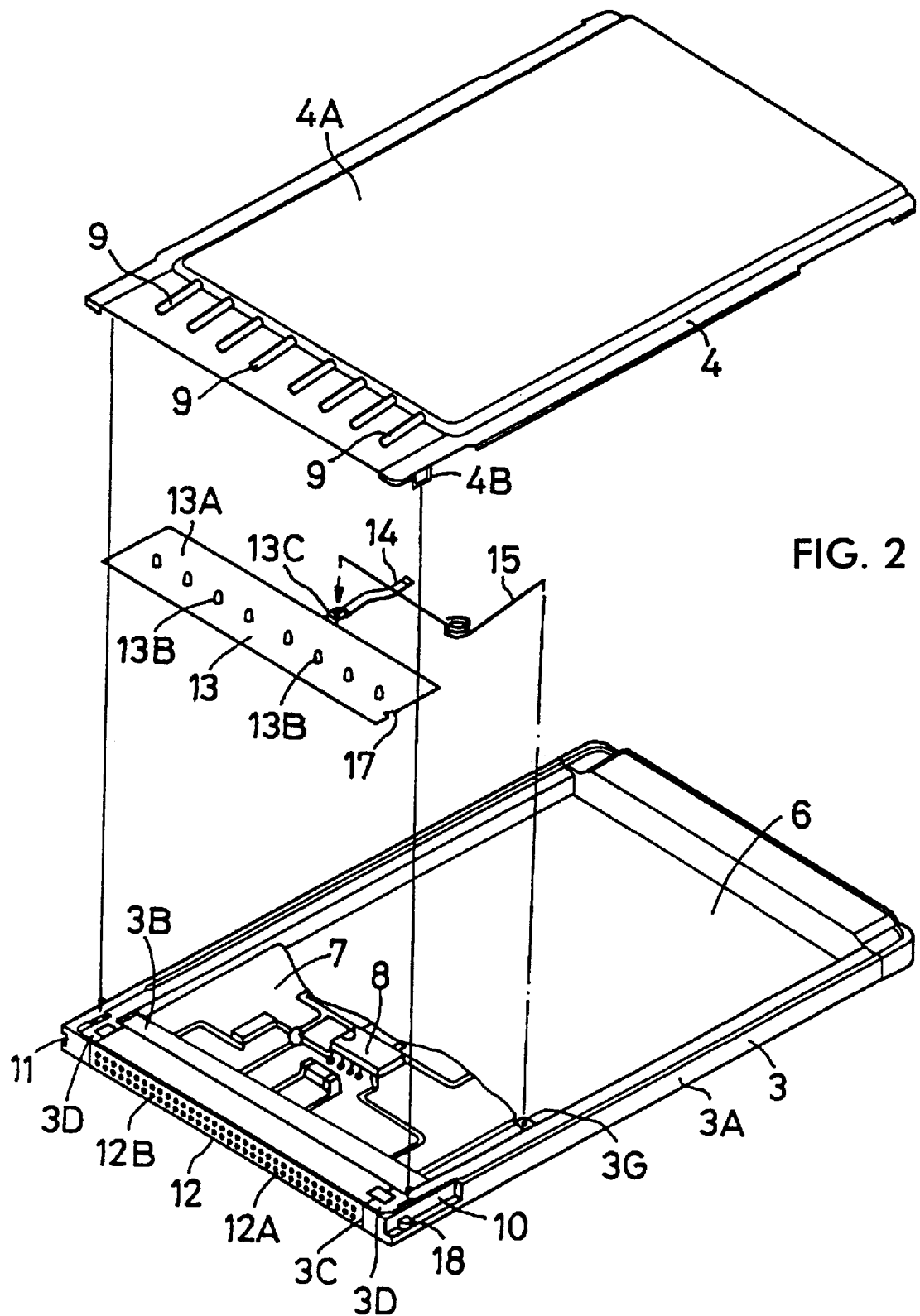
FIG. 2 is an exploded perspective view showing a frame, an upper panel, a card-side connector, a ground electrode, and the like which constitute the PC card of FIG. 2.

The frame 3, as shown in FIG. 2, is composed of a U-shape framing portion 3A, a beam 3B connecting the framing portion 3A in the front-side thereof, and a connector attaching port 3C formed in a further front side of the framing portion 3A than the beam 3B.

Figure 3:
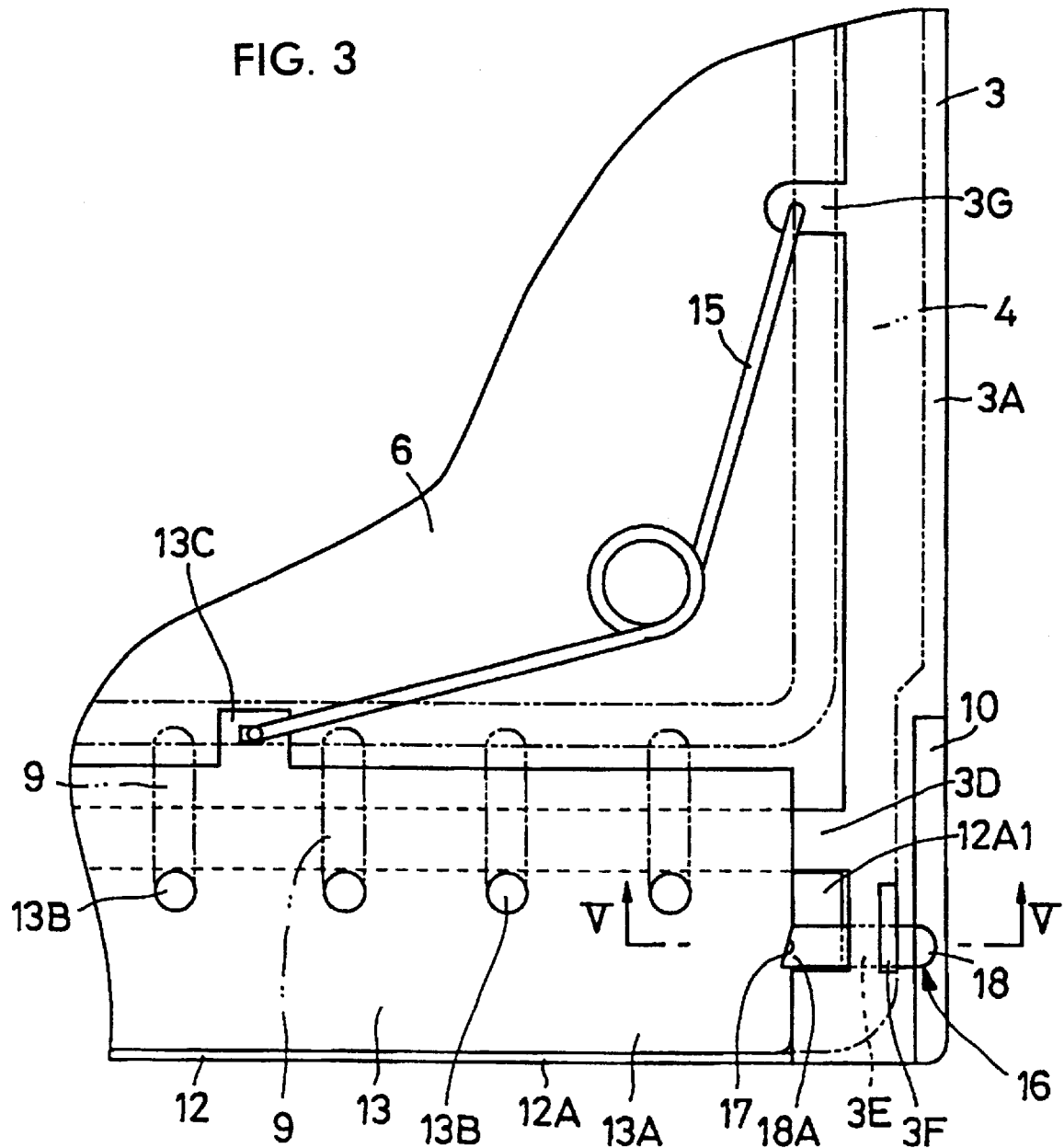
FIG. 3 is an enlarged plan view showing the ground electrode, a torsion spring, and an electrode moving mechanism attached to the frame.

As seen in FIG. 3, connector holding portions 3D having a substantial U-shape are provided for the framing portion 3A in the front side thereof, i.e., at the connector attaching port 3C side thereof, respectively. A movable-piece attaching hole 3E is provided for the connector holding portion 3D lying on the left side viewed in the card insertion direction of the framing portion 3C. The movable-piece attaching hole 3E passes through the connector holding portion 3D to communicate with the card key groove 10 side which will be descried later. On the upper face of each connector holding portion 3D, an interlocking groove 3F is provided with which an interlocking claw 4B of the upper panel 4 is interlocked (see FIG. 5).

Further, in the inner side of the framing portion 3A lying on the right side viewed in the card insertion direction, a spring-attaching portion 3G is provided to which a torsion spring 15, described later, is attached.

Further, a card-side connector 12, described later, is attached to the connector attaching port 3C. The interlocking claws 4B, 4B (see FIGS. 2, 5, etc., are provided at the upper panel 4 on the right and left sides with respect to the connector attaching port 3C, and are directed downwardly to be interlocked with the interlocking grooves 3F of the frame 3. The arrow A in FIG. 1 indicates the insertion direction of the PC card 1.

A circuit board 7 is accommodated in the board-accommodating space 6. On the circuit board 7, an electronic component 8 is mounted which constitutes a circuit adaptable for processing 32-bit bytes at a driving voltage of 3.3 V and 16-bit bytes at a driving voltage of 5.0 V.

The circuits, constituted by the electronic component 8, are capable of processing 32-bit bytes at a driving voltage of 3.3 V and 16-bit bytes at a driving voltage of 5.0 V via a change-over switch (not shown) or the like which is interlocked with an electrode moving mechanism 16, depending on the personal computer with which the PC card is equipped.

A plurality of protuberance-receiving holes 9 (FIG. 3), are formed by drilling and are provided at the upper panel 4 on the connector attaching port 3C side. Each protuberance-receiving hole 9 is elongated along the card insertion direction toward the rectangular bulge portion 4A. The protuberances 13B of the ground electrode 13 (described later) are projected through the respective protuberance-receiving holes 9.

A card-side key groove 10 includes a key-shape portion formed in the PC card 1 on the left side thereof viewed in the card insertion direction. More particularly, the card-side key groove 10, positioned in the side wall of the frame 3 on the left side viewed in the card insertion direction and near to the connector-attaching port 3C, is formed by cutting away the upper portion of the frame 3. The card-side key groove 10 is so formed as to have the groove width d1 which corresponds to the card-side key groove of the 16 bit PC card (corresponding to the predetermined high driving voltage) specified by the Standard.

A guide groove 11 is provided for the PC card 1 on the right side thereof in the card insertion direction. More particularly, the guide groove 11 is formed in the frame 3 in the vicinity of the connector attaching port 3C, on the right side viewed in the card insertion direction of the frame 3, by cutting into the side wall of the frame 3. The guide groove 11 has a groove width do specified by the Standard, as shown in FIG. 1.

A long card-side connector 12 provided in the connector attaching port 3C of the frame 3 is composed of a rectangular member 12A formed with a resin material into a long shape. The connector 12 includes 68 pin holes 12B arranged in two rows of 34 pin holes which extend from the front to the back of the rectangular member 12A, and also includes terminal pins 12C of which the base ends are positioned in the inner parts of the pin holes 12B and the tips project from the back of the rectangular member 12A for connecting to the circuit board 7, respectively. Further, positioning protuberances 12A1 are formed on the right and left sides of the rectangular member 12A. The respective positioning protuberances 12A1 are fitted, through their concavity-convexity, into the connector holding portions 3D of the frame 3 (see FIGS. 3, 5, etc.).

The ground electrode 13 is provided between the upper face of the card-side connector 12 and the upper panel 4. More particularly, the ground electrode 13, as shown in FIG. 2, is formed of an electro-conductive metal sheet, and is composed of a rectangular flat plate 13A which is elongate along the lengthwise direction of the card-side connector 12, plural (for example, eight) protuberances 13B so formed as to project from the flat plate 13A upwardly, a torsion spring 15, and a spring attaching portion 13C so formed on the back face in the card-insertion direction of the flat plate 13A as to project backward therefrom and to which the other end of the torsion spring 15 is attached.

Further, the ground electrode 13 is provided between the upper panel 4 and the card-side connector 12, movably in the card-insertion direction. Further, a triangular notch 17, which constitutes a part of the electrode moving mechanism 16, is formed on the side end of the flat plate 13A on the left side viewed in the card insertion direction.

A flat cable 14 (FIG. 2) is connected to a spring attaching portion 13C formed on the flat plate 13A of the ground electrode 13, and also, the earth of the circuit board 7.

The torsion spring 15 as an energizing means is disposed between the spring attaching portion 3G of the frame 3 and the spring attaching portion 13C of the ground electrode 13. That is, the torsion spring 15 is an energizing means for energizing the ground electrode 13 to move forward in the card insertion direction. Further, the torsion spring 15 has a spring force such that when the PC card 1 is inserted into a 32 bit card slot 21, the protuberances 13B in the respective protuberance-receiving holes 9 can not move backward, and when the PC card is inserted into a 16 bit card slot 31, these protuberances 13D can move backward in the card insertion direction.

The electrode moving mechanism 16 (FIGS. 2, 3, 4) as an electrode moving means is composed substantially of the triangular notch 17 formed on the side end on the left side viewed in the card insertion direction of the ground electrode 13, and a movable piece 18 made of a substantially L-shape sheet and received in a movable-piece attaching hole 3E of the connector holding portion 3D. The base end of said movable piece 15 comes into detachable contact with the notch 17, where the top end of said movable piece 18 is projected to the card-side key groove 10 side.

Figure 5:
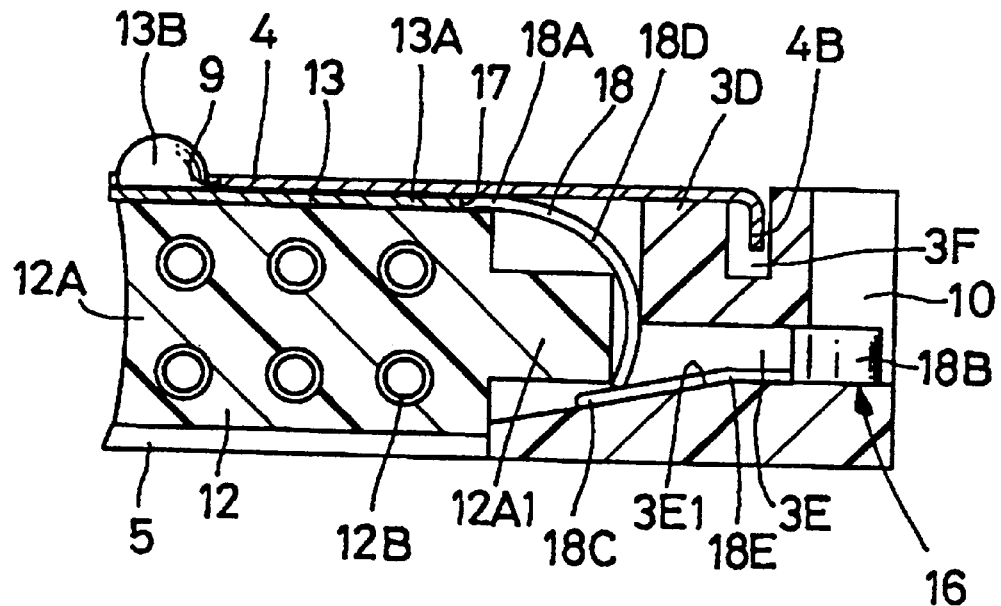
FIG. 5 is a longitudinal sectional illustration of the PC card, taken in the direction of an arrow V—V of FIG. 3.

As shown in FIG. 5, the movable piece attaching hole 3E is formed as a rectangular hole of which one end is opened on the card-side key groove 10 side, and which is elongate toward the connector holding portion 3D side opposite to the card key groove 10 side. The lower face of the movable piece attaching hole 3E has an inclined face 3E1 which is inclined downwardly from the card-side key groove 10 side toward the connector holding portion 3D side.

Further, as shown in FIGS. 3 through 7, the movable piece 18 is formed by bending a thin sheet with spring properties, and is composed of an engaging portion 18A formed on the base-end side of the thin sheet which comes into detachable contact with the notch 17 of the ground electrode 13; a projecting portion 18B provided on the top side of the thin sheet and projecting to the card key groove 10 side; a bending portion 18D which bends sharply at portion 18C by turning-up about 180° at substantially the middle portion in the lengthwise direction of the thin sheet toward the engaging portion 18A; and an inclined portion 18E elongate from the turning-up portion 18C to the projecting portion 18B and inclined along the inclined face 3E1 of the movable piece attaching hole 3E.

The movable piece 18 is disposed in the movable-piece attaching hole 3E and the gap between the connector holding portion 3D and the positioning protuberance 12A1. More particularly, the turning-up portion 18C of the movable piece 18 is positioned in the lower side of the gap between the lower face of the positioning projecting portion 12A1 and the inclined face 3E1 of the movable piece attaching hole 3E. The inclined portion 18E is provided along the inclined face 3E1. The bent portion 18D is disposed in the longitudinal gap between the connector holding portion 3D and the positioning projecting portion 12A1, and also in the lower side gap in such a manner that the engaging portion 18A extends toward the flat plate 13A. Further, since the movable piece 18 is made of a sheet with spring properties, the engaging portion 18A is moved toward the ground electrode 13 side when the projecting portion 18B is pushed toward the connector holding portion 3D side.

With the electrode moving mechanism 16 configured as described above, as shown in FIGS. 3 through 5, when the projecting portion 18B is projected from the card key groove 10, the engaging portion 18A of the movable piece 18 is engaged with the notch 17 of the ground electrode 13. This prevents the ground electrode 13 from being moved backward in the card insertion direction.

Figure 7:
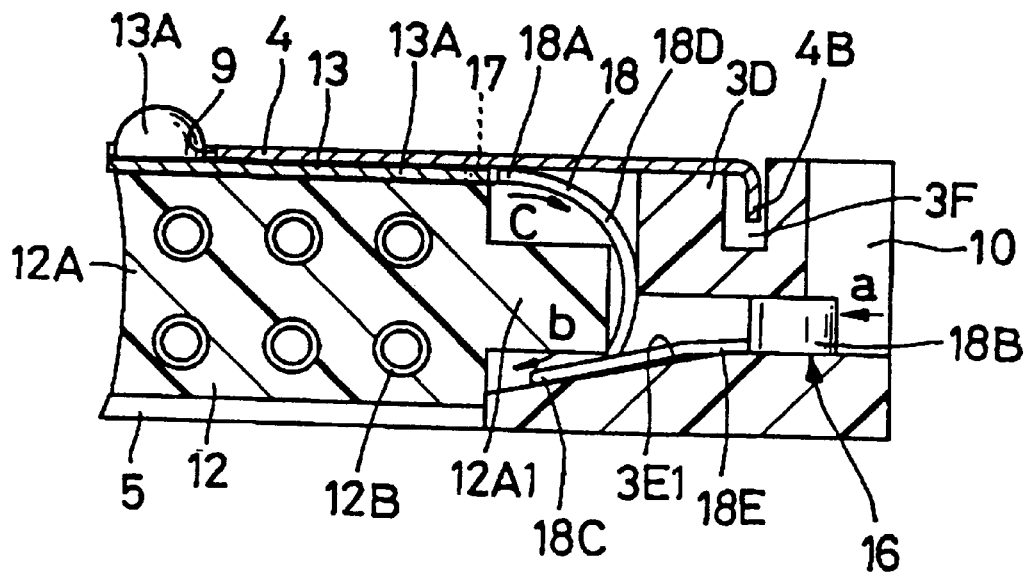
FIG. 7 is a longitudinal sectional view of the PC card, taken in the direction of an arrow VII—VII of FIG. 6.

On the other hand, as shown in FIG. 7, when the projecting portion 18B is inserted into the connector holding portion 3D in the direction indicated by the arrow a, the turning-up portion 18C of the movable piece 18 is moved into the inner part of the inclined surface 3E1 in the direction by the arrow b. With the movement of the turning-up portion 18C, the bent portion 18D is pulled so that the engaging portion 18A is moved in the direction indicated by the arrow c, and thereby, the engaging portion 18A moves out of and disengages with the notch 17 of the ground electrode 13. This enables the ground electrode 13 to move in the card insertion direction.

Figure 8:
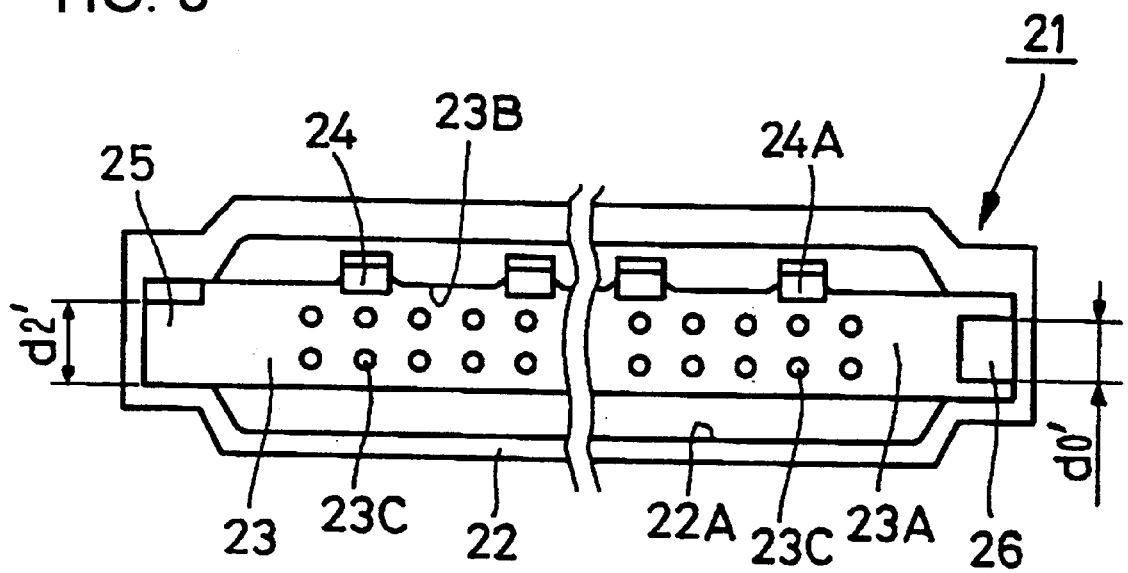
FIG. 8 is a front view of a 32-bit PC card slot.

The 32 bit card slot 21 shown in FIG. 8 is composed mainly of a housing 22 having a card insertion hole 22A which has a size larger to some degree than the outside size of the PC card 1, and a slot-side connector 23 provided in the inner part of the card insertion hole 22A of the housing 22.

The slot-side connector 23 is composed of a rectangular member 23A formed with a resin material in a long shape and having a connector insertion hole 23B into which the card-side connector 12 is inserted and is in communication with the card insertion hole 22A. A total of 68 connecting pins 23C are positioned in the inner part of the connector insertion hole 23B formed in the rectangular member 23A, and projecting therefrom in two rows of 34 pins.

Figure 10:
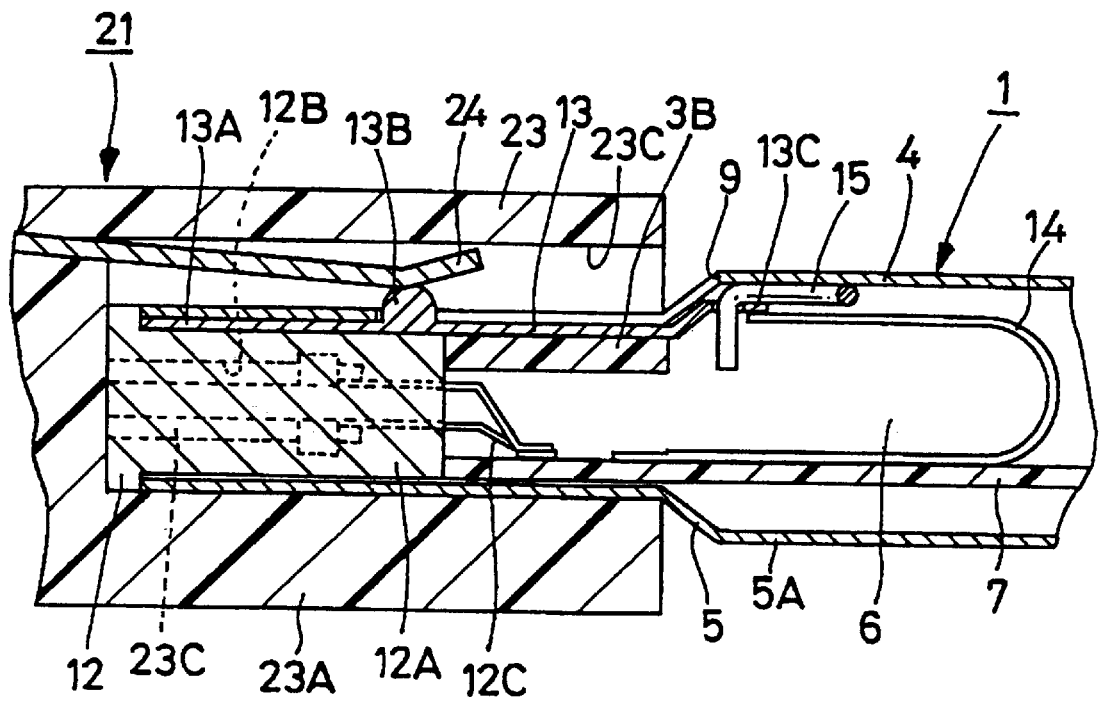
FIG. 10 is an enlarged sectional view showing the PC card inserted into the 32 bit card slot.

When the card-side connector 12 of the PC card 1 is inserted into the connector insertion hole 23B of the slot-side connector 23, the tips of the connecting pins 23C are connected to the terminal pins 12C positioned in the inner parts of the pin holes 12B, respectively (see FIG. 10).

A receiving ground electrode 24 formed in the upper part of the connector insertion hole 23B comprises plural contact pieces 24A (for example, eight pieces) which are directed downwardly and have spring properties. Each contact piece 24A of the receiving ground electrode 24, when the PC card 1 is inserted into the card insertion hole 22A, comes into contact with the respective protuberances 13B of the ground electrode 13 (see FIG. 10).

A slot-side key groove 25 is formed on the left side viewed in the card insertion direction of the slot-side connector 23. More particularly, the slot-side key groove 25 has a wide groove width d2' which is slightly wider than the value obtained by subtracting the groove width d2 of the card-side key groove 10 from the thickness of the frame 3 of the PC card 1.

A guide protuberance 26 is formed on the right side viewed in the card insertion direction of the slot-side connector 23, and has a thickness d0' which is slightly greater than the groove width do of the guide groove 11 of the PC card 1.

Figure 9:
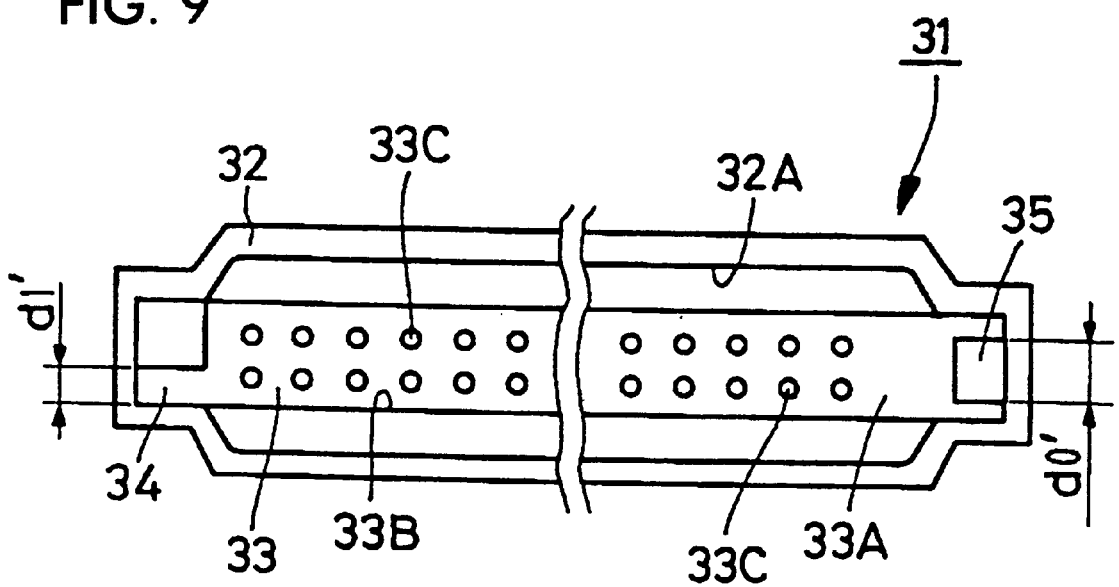
FIG. 9 is a front view of a 16-bit PC card slot.

A 16-bit card slot 31, as shown in FIG. 9, is composed mainly of a housing 32 having a card insertion hole 32A which has a size larger to some degree than the outside size of the PC card, and a slot-side connector 33 provided in the inner part of the card insertion hole 32A of the housing 32.

The slot-side connector 33 is composed of a rectangular member 33A formed with a resin material in a long shape, having a connector insertion hole 33B into which the card-side connector 12 is inserted, and being in communication with the card insertion hole 32A. A total of 68 connecting pins 33C are positioned in the inner part of the connector insertion hole 33B formed in the rectangular member 33A and projecting therefrom in two rows of 34 pins.

Figure 11:
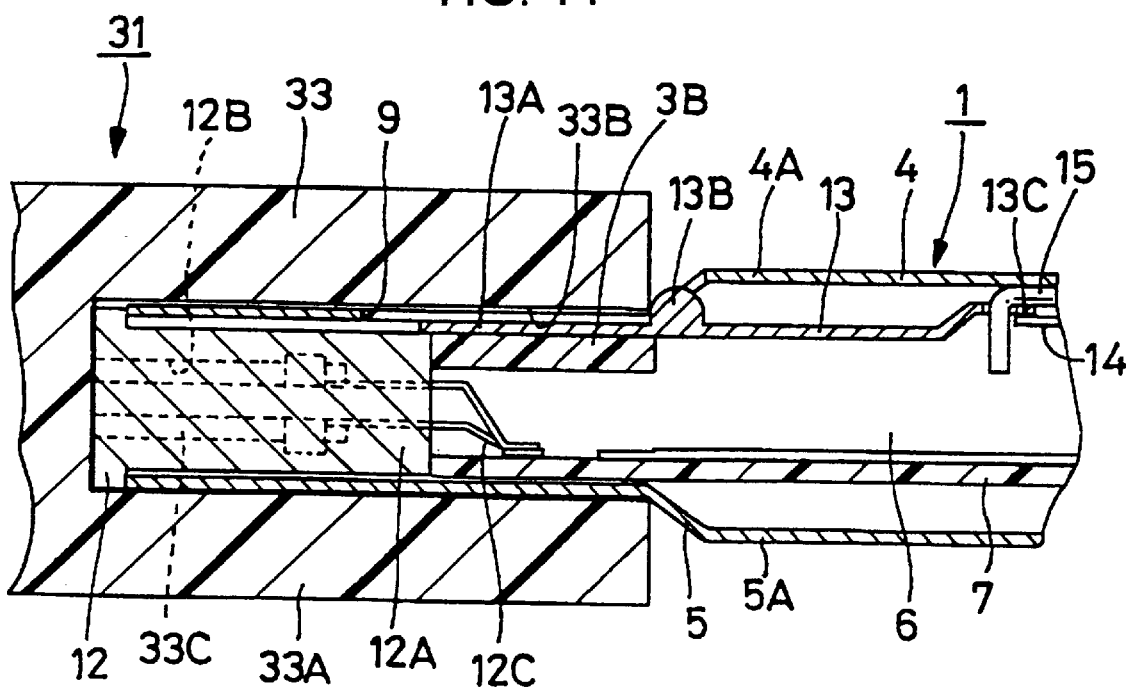
FIG. 11 is an enlarged sectional view showing the PC card inserted into the 16 bit card slot.

When the card-side connector 12 of the PC card 1 is inserted into the connector insertion hole 33B of the slot-side connector 33, the tips of the connecting pins 33C are connected to the terminal pins 12C positioned in the inner parts of the pin holes 12B, respectively, (see FIG. 11).

A slot-side key groove 34 is formed on the left side viewed in the card insertion direction of the rectangular member 33A. More particularly, the slot-side key groove 34 is provided in the vicinity of the connector insertion hole 33B of the rectangular member 33A of the slot-side connector 33, positioned on the left side viewed in the card insertion direction, and is formed by cutting into the side wall of the rectangular member 33A along the card insertion direction. Further, the slot-side key groove 34 has a groove width d1' which is slightly greater than the value obtained by subtracting the groove width d1 of the card-side key groove 10 from the thickness of the frame 3 of the PC card 1.

A guide protuberance 35 is provided on the right side viewed in the card insertion direction of the rectangular member 33A. More particularly, the guide protuberance 35 is formed by cutting along the card insertion direction, the side wall of the rectangular member 33A which lies in the vicinity of the connector insertion hole 33B of the rectangular member 33A of the slot-side connector 33, on the right side viewed in the card insertion direction. The guide protuberance 35 has a thickness d0' which is slightly smaller than the groove width d0 of the guide groove 11 of the PC card 1.

Details of the PC card 1, having the above-described configuration, being inserted into the above-described 32-bit card slot 21 will now be described with reference to FIGS. 3, 5, 8, and 10. When the card-side connector 12 is inserted into the slot-side connector 23, the card-side key groove 10 is guided by the slot-side key groove 25, and the guide groove 11 by the guide protuberance 26.

Figure 4:
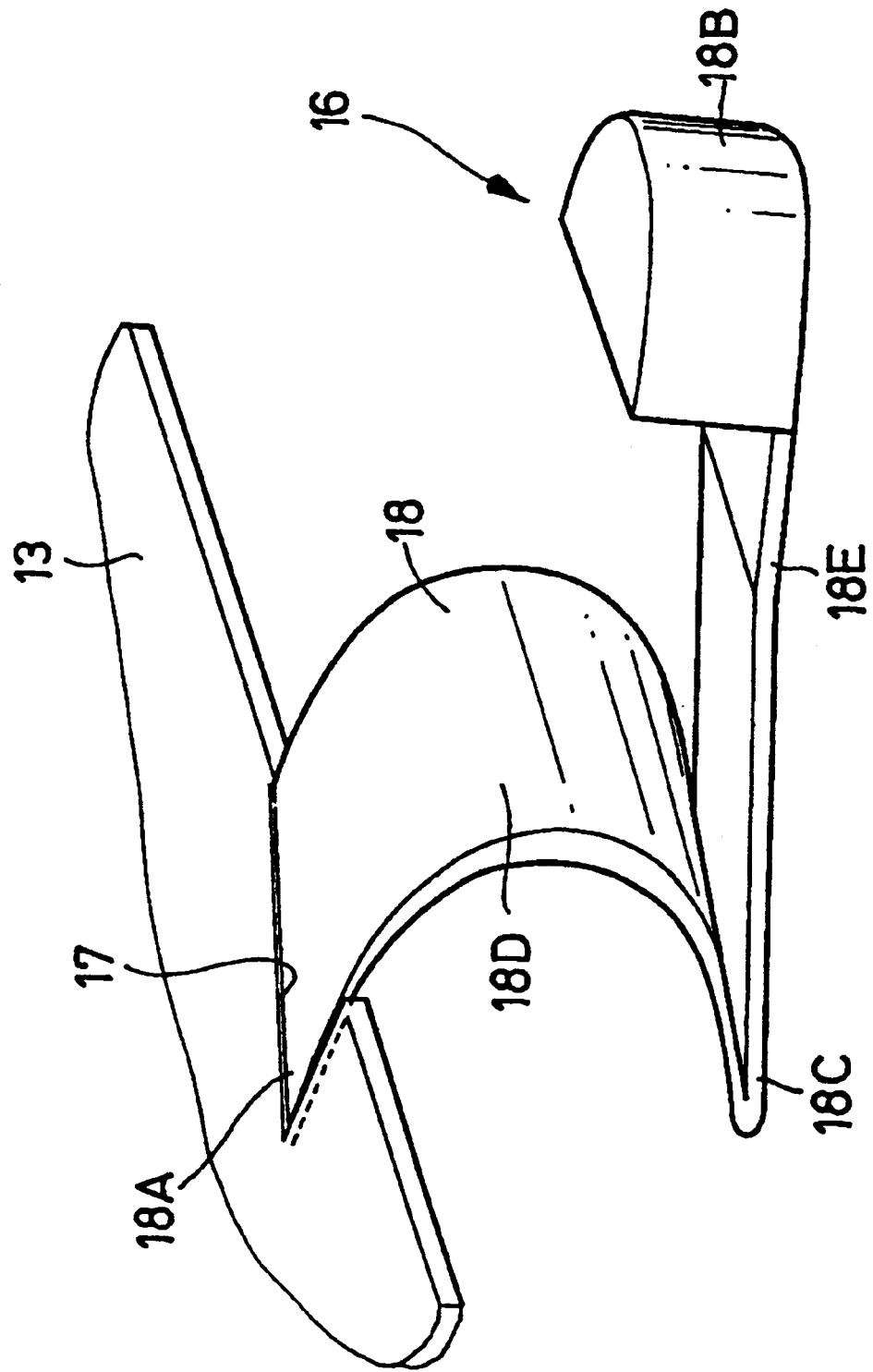
FIG. 4 is an enlarged perspective view showing a notch and a movable piece, which constitute the electrode moving mechanism, are attached.

When the PC card 1 is inserted into the card slot 21, the projecting portion 18B is in state that it is moved to the card-side key groove 10 side, because there is a gap between the projecting portion 18B of the electrode moving mechanism 16 and the side wall of the slot-side key groove 25. As shown in FIGS. 3, 4, and 5, the engaging portion 18A of the movable piece 18 is engaged with the notch 17 of the ground electrode 13, so that the ground electrode 13 is prevented from being moved backward in the card insertion direction due to the electrode moving mechanism 16.

As shown in FIG. 10, when the PC card 1 is inserted into the 32 bit card slot 21, the respective protuberances 13B of the ground electrode 13 can be securely connected to the contact pieces 24A of the receiving ground electrode 24 on the card slot side 21, while the protuberances 13B are prevented from being moved backward in the card insertion direction in the protuberance-receiving holes 9.

Details of the PC card 1 being inserted into the 16-bit card slot 31 will now be described with reference to FIGS. 6, 7, 9, and 11. When the PC card 1 is inserted into the 16-bit card slot 31, the card-side key groove 10 is guided by the slot-side key groove 34, and the guide groove 11 by the guide protuberance 35.

More particularly, when the PC card 1 is inserted into the card slot 31, the projecting portion 18B is pushed toward the connector holding portion 3D side, because there is no gap between the projecting portion 18B of the electrode moving mechanism 16 and the slot-side key groove 34. Accordingly, as shown in FIGS. 6 and 7, the engaging portion 18A of the movable piece 18 moves out of the notch 17 of the ground electrode 13 and disengages, which enables the ground electrode 13 to move in the card insertion direction.

As shown in FIG. 1, when the PC card 1 is inserted into the 16 bit card slot 31, the respective protuberances 13B of the ground electrode 13 are pushed by the rectangular member 33A of the slot-side connector 33, so that the ground electrode 13 is moved backward in the card insertion direction against the spring force of the torsion spring 15.

Thus, the PC card 1, when it is applied to the 16 bit card slot 31, can be inserted without any damage to the 16 bit card slot 31 and the PC card 1.

Concurrently, as shown in FIGS. 3 and 6, the opening angle of the torsion spring 15 becomes narrow. Accordingly, when the PC card 1 is extracted from the card slot 31, the ground electrode 13 is moved forward in the card insertion direction, caused by the restoring force of the torsion spring 15. Thus, the movable piece 18 of the electrode moving mechanism 16 is restored with its spring force, causing the projecting portion 18B to project from the card-side key groove 10, and, moreover, causing the engaging portion 18A to engage with the notch 17 of the ground electrode 13 so that the ground electrode 13 is prevented from moving backward in the card insertion direction.

As a result, the PC card 1 of the instant can be inserted without any damage into the card inserting hole 32A of the 16 bit card slot 31, the connector inserting hole 33B of the slot-side connector 33, and the like. In addition, after the PC card 1 is extracted, the ground electrode 13 can be moved forward in the card insertion direction. Accordingly, the PC card 1 can be also inserted into the 32 bit card slot 21.

As described above, the PC card 1 of the instant embodiment can be inserted into either of the 32 bit and 16 bit card slots 21 and 31. That is, the PC card 1 can be used in a wider range of situations.

In the above-described embodiment, in the vicinity of the card-side key groove 10, provided is the electrode moving mechanism 16 by which when the PC card 1 is inserted into the 16 bit card slot 31, the ground electrode 13 can be moved backward in the card insertion direction, and when the PC card is inserted into the 32 bit card slot 21, the ground electrode 13 is prevented from being moved backward in the card insertion direction. The present invention is not limited to the instant embodiment. With only the torsion spring 15 which energizes the ground electrode 13 to move forward in the card insertion direction, similar operation and effects can be obtained. In this case, the torsion spring 15 may have such a spring force that when the PC card 1 is inserted into the 32 bit card slot 21, the ground electrode 13 is not moved, and when it is inserted into the 16 bit card slot 31, the ground electrode 13 can be moved.

In the above embodiment, the connection between the ground electrode 13 and the circuit board 7 is achieved by a flat cable 14 as shown in FIG. 2. However, for securing of the grounding, the flat cable having a larger width or having plural conductors may be employed. Further, instead of the flat cable, a lead wire is available. The connection between the flat cable and the circuit board 7 or between the lead wire and the circuit board 7 may be carried out by any means such as soldering, pressure contact, and so forth, provided that electrical connection can be achieved by the means.

As the PC card, standardized 32 bit and 16 bit PC cards have been described. However, according to the present invention, for example, standardized 64 bit and 128 bit PC cards or the like may be applied to the 16 bit card connector. Thus, the PC card is not limited to the standardized ones of the embodiments.

There is commercially available a personal computer having a special 16 bit card slot with a driving voltage of 3.3 V. The present invention has similar applicability in such computers.

As described above, according to the present invention, the one panel is provided with the long protuberance-receiving holes in the position thereof corresponding to the connector attaching port of the frame, the protuberance-receiving holes being elongate in the card insertion direction and being formed by drilling. The ground electrode is formed of the flat plate disposed between the connector and the one panel and is movable forward and backward in the card insertion direction. The protuberances are formed on the flat plate and projected through the respective protuberance receiving holes. The ground electrode is provided with the means for energizing the ground electrode to move forward in the card insertion direction. Thus, when the PC card is inserted in the card slot corresponding to the predetermined low driving voltage, the respective protuberances in the protuberance-receiving holes are connected to the ground electrode of the card slot, not moving backward in the card insertion direction in the protuberance-receiving holes. When the PC card is inserted into the card slot corresponding to the predetermined high driving voltage, the respective protuberances in the protuberance-receiving holes can be moved backward in the card insertion direction against the energizing force of the energizing means. Thus, whichever of systems corresponding to the high and low driving voltages the card slot for the PC card to be inserted may have, the PC card can be inserted into the card slot without damage to the PC card or the card slot. That is, the PC card can be applied widely.

The frame is preferably provided with the electrode moving means by which the ground electrode can be moved backward in the card insertion direction against the energizing means. Accordingly, for example, when the PC card is inserted into the card slot corresponding to the predetermined high driving voltage, the ground electrode is moved backward in the card insertion direction against the energizing means by means of the electrode moving means, so that the respective protuberances in the protuberance-receiving holes can be moved backward in the card insertion direction.

Preferably, according to the present invention, the key-shape portion is provided for the frame in the position thereof near to the connector attaching port, and the electrode moving means is provided in the vicinity of the key-shape portion. Thus, by means of the electrode moving means, in the case that the card slot corresponds to the predetermined high driving voltage, the ground electrode can be moved backward in the card insertion direction, and in the case that the card slot corresponds to the predetermined low driving voltage, the ground electrode is prevented from moving backward in the card insertion direction. Thus, the PC card can be inserted into either of the card slots corresponding to the high driving voltage and the low driving voltage, respectively. That is, the PC card can be applied widely.

Preferably, the electrode moving means is composed of the notch formed on the flat plate of the ground electrode, and the movable piece of which the base end comes into contact with the notch may be detachably engaged. The tip is projected to the key-shape portion provided for the frame near to the connector attaching port side. Accordingly, by pushing-in the tip of the movable piece projected to the key-shape portion side by means of the side wall of the key-shape portion on the card slot side, the ground electrode is enabled to move by means of the electrode moving means. Thus, the PC card can be also inserted into the card slot in the case that it corresponds to the low driving voltage.

Preferably, the key-shape portion is so formed as to have a groove width which corresponds to the predetermined high driving voltage with respect to the card slot. Thus, when the PC card is inserted into the card slot corresponding to the low driving voltage, the electrode moving means prevents the ground electrode from moving backward in the card insertion direction. On the other hand, when the PC card is inserted into the card slot corresponding to the high driving voltage, the electrode moving means is automatically released, enabling the ground electrode to be moved in the card insertion direction. Thus, the PC card can be also inserted into the card slot even if it corresponds to the low driving voltage.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A personal computer (PC) card for electrical and mechanical communication with a personal computer card slot, the PC card comprising:

a frame having forward and rearward ends and sides defining an interior volume, the forward and rearward ends defining forward and rearward directions corresponding to respective card insertion and removal directions into and out of the personal computer card slot;

a circuit board disposed within the volume and including a ground;

a connector disposed at the forward end of the frame which provides an electrical interface between the circuit board and the PC card slot; and a ground electrode coupled to the ground of the circuit board and disposed on the connector, the ground electrode being movable in the forward and rearward directions with respect to the frame such that it may make contact with a receiving ground electrode of the PC card slot.

2. The PC card of claim 1, further comprising a resilient element biasing the ground electrode in the forward direction.

3. The PC card of claim 2, wherein the resilient element is a spring coupled from the frame to the ground electrode.

4. The PC card of claim 1, further comprising a cover spanning the frame to enclose the interior volume, the cover including a plurality of elongate apertures, the ground electrode being disposed between the connector and the cover and including a plurality of protuberances extending through the respective apertures.

5. The PC card of claim 4, wherein the apertures and protuberances are sized and shaped to permit the protuberances to slidably communicate through the apertures as the ground electrode moves.

6. The PC card of claim 1, further comprising a movable piece having a first end operable to engage and disengage the ground electrode to, respectively, prevent and permit it from moving in the forward and rearward directions, the linkage having a second end including a projecting member, the first end of the movable piece engaging and disengaging the ground electrode as a function of a displacement of the projecting member.

7. The PC card of claim 6, wherein the movable piece is disposed in a transverse direction with respect to the forward direction, the projecting member displacing in the transverse direction such that the first end of the movable piece engages and disengages with a side of the ground electrode.

8. The PC card of claim 6, wherein the frame includes a card key proximate to the connector, the projecting member of the movable piece communicating with the card key and a cam of the card slot, the projecting member displacing as a function of a size and shape of the cam when the PC card is inserted into the PC card slot.

9. The PC card of claim 8, wherein the movable piece is sized and shaped to (i) disengage the first end thereof from the ground electrode and permit it to move in the rearward direction when the projecting member displaces a first amount indicative of a high supply voltage potential PC card slot; and (ii) engage the first end thereof with the ground electrode and prevent it from moving when the projecting member displaces a second amount indicative of a low supply voltage potential PC card slot.

10. The PC card of claim 9, wherein the first amount of displacement is substantially greater than the second amount of displacement.

11. The PC card of claim 6, wherein the movable piece includes a fulcrum located between the first and second ends of the movable piece, the fulcrum translating the displacement of the projecting member with displacement of the first end of the movable piece.

12. The PC card of claim 11, wherein the fulcrum includes a reentrant bend translating the displacement of the projecting member in an opposite direction to that of the first end of the movable piece.

13. The PC card of claim 11, wherein the includes a first length from the first end to the fulcrum and a second length from the fulcrum to the projecting member, the first length being resiliently curvilinear such that as the projecting member displaces the fulcrum, the first end moves in an opposite direction from the fulcrum.

* * * * *